(12) United States Patent
Rao

(10) Patent No.: US 7,514,942 B2
(45) Date of Patent: Apr. 7, 2009

(54) PROBE BASED PATTERNING OF MICROELECTRONIC AND MICROMECHANICAL DEVICES

(75) Inventor: Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 224 days.

(21) Appl. No.: 11/528,785

(22) Filed: Sep. 27, 2006

(65) Prior Publication Data

US 2008/0074126 A1 Mar. 27, 2008

(51) Int. Cl.
*G01R 31/02* (2006.01)

(52) U.S. Cl. ............... 324/754; 324/158.1; 369/126

(58) Field of Classification Search ......... 324/754–765, 324/158.1; 250/306; 29/846; 438/52; 369/126; 73/105
See application file for complete search history.

(56) References Cited

U.S. PATENT DOCUMENTS

| | | | | |
|---|---|---|---|---|
| 5,373,494 A | * | 12/1994 | Kawagishi et al. | 369/126 |
| 5,426,631 A | * | 6/1995 | Miyazaki et al. | 369/126 |
| 5,526,334 A | * | 6/1996 | Yamano et al. | 369/53.44 |
| 5,610,898 A | * | 3/1997 | Takimoto et al. | 369/126 |
| 5,717,680 A | * | 2/1998 | Yamano et al. | 369/126 |
| 5,778,134 A | * | 7/1998 | Sakai et al. | 386/46 |
| 2003/0178988 A1 | * | 9/2003 | Kim | 324/158.1 |
| 2005/0040836 A1 | * | 2/2005 | Altmann et al. | 324/754 |
| 2005/0056783 A1 | * | 3/2005 | Kley | 250/309 |
| 2005/0237597 A1 | | 10/2005 | Epitaux et al. | |
| 2006/0076918 A1 | | 4/2006 | Sri-Jayantha | |
| 2006/0147150 A1 | | 7/2006 | Epitaux | |
| 2006/0187803 A1 | | 8/2006 | Baechtold et al. | |
| 2006/0289954 A1 | * | 12/2006 | Bar-Sadeh et al. | 257/415 |

OTHER PUBLICATIONS

H.Schulz, et al., "New Polymer Materials for Nonoimprinting", J. Vac. Sci. Technol. B, vol. 18, No. 4, Jul./Aug. 2000.

* cited by examiner

*Primary Examiner*—Ha Tran T Nguyen
*Assistant Examiner*—Arleen M Vazquez
(74) *Attorney, Agent, or Firm*—Blakely, Sokoloff, Taylor & Zafman LLP

(57) ABSTRACT

Patterning of microelectronic and micromechanical devices is described using probes. In one example, a plurality of probe tips are driven into a processing layer of a substrate. The probe tips are carried by movable sleds. The sleds are moved to write patterns into the processing layer using the probes, and the processing layer is processed to form features on the substrate.

20 Claims, 4 Drawing Sheets

PROBE BASED PATTERNING OF MICROELECTRONIC AND MICROMECHANICAL DEVICES

BACKGROUND

1. Field

The present description relates to the field of patterning microelectronic and micromechanical devices, and in particular, to forming patterns using an array of probe tips to indent a photoresist or mask layer.

2. Related Art

To increase the number of transistors, diodes, resistors, capacitors, and other circuit elements on an integrated circuit chip, these devices are placed closer and closer together. This requires that each device be made smaller.

Current manufacturing technologies use laser light with a wavelength of 193 nm for photolithography. These are referred to as Deep Ultraviolet (DUV) systems. These systems which are the workhorses of 65 nm lithography in 2006 are being continuously improved and are projected to be used to produce features as small as 20 nm. However, at this point, it is anticipated that a different technology must be applied.

One obstacle to producing still smaller features is the wavelength of the light being used. The next step that has been proposed is to use light of 13.4 nm, or other wavelengths in the range of 4 nm-30 nm, referred to as Extreme Ultraviolet (EUV) light. Depending on the rest of the system and process parameters, this light may allow features to be created that are less than 20 nm across and probably as small as 10 nm or less across.

The smaller size of the printed features is a result of the improvement in resolution. The resolution of a photolithography system is proportional to the wavelength of the light divided by the numerical aperture of the illumination system's projection optics. As a result, the resolution can be improved by either decreasing the wavelength of the light used, or by increasing the numerical aperture (NA) of the photolithography projection optics, or both.

As the wavelength of the illumination light gets smaller, the lithography process becomes more difficult and more expensive. One popular wavelength for proposed EUV photolithography is 13.5 nm. All known materials absorb light at this frequency. As a result, the projection optics cannot be made using transparent lenses and the best mirrors so far developed reflect only about 70% of the light that shines on them. The other 30% of the light is absorbed by the mirror. This compares poorly with even poor quality visible light mirrors that reflect more than 95% of the light that shines on them. The absorption of EUV light also produces unwanted heat and wear on any materials that may be used in an EUV photolithography process, included the materials in the mask.

In addition, the masks proposed for EUV are to be fabricated with E-Beam lithography. The combination of the difficult EUV light and E-Beam patterning is expected to be significantly more costly than the current optical methods.

Another difficulty is the high speed desired in semiconductor manufacturing to keep costs down and volumes high. A modern photolithography plant can pattern hundreds of wafers per hour. Alternative approaches to photolithography include imprint and direct write lithography with charged particle beams. The imprint lithography requires masks or stamping tools that are the same size as the features to be patterned. These are expected to be very hard to make without some defects. Direct write lithography is a serial writing approach using, for example, an E-beam and is expected to be too slow for high volume manufacturing.

BRIEF DESCRIPTION OF THE DRAWINGS

Embodiments of the present invention may be understood more fully from the detailed description given below and from the accompanying drawings of various embodiments of the invention. The drawings, however, should not be taken to be limiting, but are for explanation and understanding only.

DETAILED DESCRIPTION

New ways to pattern substrates are described. These can be used instead of or in combination with current techniques that use electromagnetic radiation (light, X-Rays etc) or charged particle beams (E-Beam, Ion Beam etc). As described below, a sharp mechanical probe tip may be used to indent or emboss patterns directly into photoresist or any other suitable material. The probe is attached to a high precision X-Y positioning stage. Current stages can position a probe to within fractions of a nanometer. This may allow for significantly smaller features to be produced than even EUV will be able to achieve.

By forming an array of probes on an X-Y positioning stage, with each probe scanning a small area, large substrate areas may be patterned in a short amount of time. This is accomplished by taking advantage of the parallelism afforded by the many probes. Even though the scan travel of a single probe tip may be small (for example about 50 micrometers), a large area can be covered with an array of probes all attached to the same positioning stage. Such an approach can be used for very low cost lithography both in manufacturing and in making masks. In addition to the X-Y positioning of the probes from the scanning stage, a vertical or Z actuation of the probes may be used to turn individual probes ON or OFF for writing or embossing.

Parallel arrays of probes are currently being investigated under the name of seek and scan probe technology. Prototypes have been developed primarily for rewritable memory arrays. The prototype memory array uses an array of probe tips to write and read data bits onto a surface, such as a phase change material (Chalcogenide glass) or ferro-electric material, that serves as the memory storage medium. Another approach uses probes to write the data bits into a polymer. The data is erased by melting the polymer.

Figure 1:
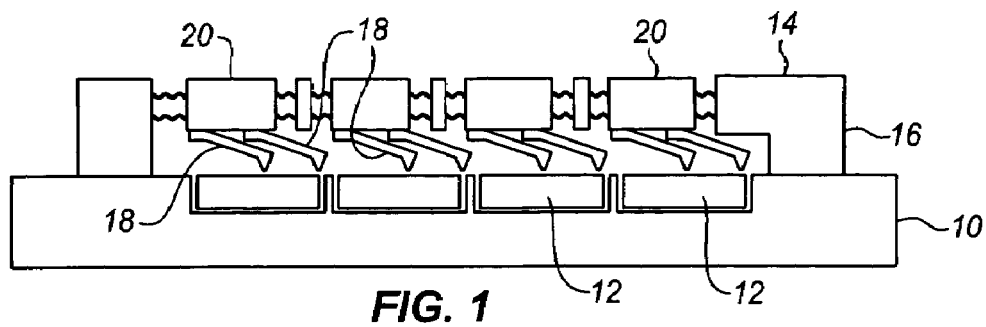
FIG. 1 is a cross-sectional diagram of a probe carriage mounted to a substrate to be patterned with an array of probe tips according to an embodiment of the invention.

As shown in the cross-sectional diagram of FIG. 1, a substrate may be patterned using an array of probe tips. This allows different areas of a large substrate to be patterned in parallel. A substrate 10 to be patterned, such as a conventional 300 mm wafer is divided into an array of chips 12. These may be 10 mm square although the particular dimensions may be adapted to suit different embodiments. The substrate is attached to a probe carriage 14 using clamps 16. The probe carriage carries a parallel array of probes 18 for each chip. Each 10 mm square chip may be divided into e.g. 10,000 domains of 0.1 mm square with one probe for each domain. The probes are each attached to an X-Y scanning stage or sled 20 that is mounted to and held in place by the carriage. However, the particular size of each scanning stage and number of probes may be adapted to suit any particular embodiment.

Each X-Y scanning stage can be moved in the X (horizontal) and Y (vertical) direction. In one embodiment, each stage can be operated independently of every other stage. This allows a probe to draw any 2-dimensional shape on the surface of the substrate. The probes may be independently operated in the Z or normal direction. This allows each probe to independently be lifted off the substrate or pressed into the substrate. The stage can therefore move to a position without contacting the substrate and then the probe may be lowered, once the stage reaches a position, to begin indenting a pattern into the substrate. In addition the stage may make a pattern using all of the probes or only some of the probes.

In use, the substrate to be patterned is clamped to the probe carriage containing the probes and X-Y positioning stages. The substrates are clamped together so that the probe tips are in contact with the surface of the substrate to be patterned. The surface of the substrate is coated with the thin film to be patterned. This film could be a polymer such as a photoresist or any material that undergoes a physical, chemical or phase transformation with a spatial extent that is comparable to the probe tip dimensions, when the probe tip comes into contact with the film.

Suitable materials include poly methyl methacrylate (PMMA), amorphous thermoplastic polymers and thermoset prepolymers such as poly diallyl phthalate (PDAP), among others. These materials have different glass transition temperatures and may provide better results at different temperatures or with different thermal processing. PMMA, for example, provides stable, durable patterns when imprinted at about 200° C. The thermoset polymers may be etched and then heat treated for cross linking.

For convenience this film, regardless of its composition, will be referred to as a resist. The transformation in the film to produce the patterns may be induced by mechanical force, heat, light (through near field optical beams at the end of a probe), an electric field or the flow of electric current. Electric current may be applied through the film when the tip is biased with a static or time varying voltage or magnetic fields created with a magnetized tip or with small coils fabricated on the cantilever or tip structure. By exciting the X-Y scanning stages, the entire surface of the substrate photoresist may be patterned in small portions in parallel. An electronic control system (not shown) is coupled to the probe carriage to control and drive the movements of the scanning stages and probes.

After the resist is patterned, the image may be transferred to the underlying films through conventional semiconductor processing such as etching and or deposition and lift-off approaches. This allows the use of the probe carriage to be integrated into conventional semiconductor, micromechanical and microelectronic manufacturing processes. Rather than exposing the resist to a light source, the resist is imprinted or written upon by the probes, invoking one of the variety of mechanisms described earlier. The patterning may be improved by choosing or designing a photoresist for its mechanical properties. Well known polymers such as those used for photoresists may also be used for this probe based patterning approach.

For photolithography, an important design constraint for the photoresist is how it responds to the light to which it is being exposed. The best photoresist for light sensitivity may not be the best photoresist for probe based patterning. Since the photoresist is not exposed, it may be selected for its response to other parameters such as mechanical and thermal, properties.

An entire wafer may be patterned at one time using parallelism. A single silicon wafer may contain 200 separate chips, although the exact number will depend upon the application. The surface of each chip may be written with its own set of cantilevers. There are 10,000 in the example above. The cantilevers are each attached to the scanning stages in the probe carriage. To simultaneously write a surface on every chip, the scanning stages for each chip may be replicated for each chip, making, for example 200 sets of scanning stages. All of these scanning stages may be made a part of the probe carriage and work in parallel to write all the chips in one product wafer at the same time.

The probe carriage may be fabricated out of a silicon wafer of identical size to the product wafer that is being patterned. The lithography system for a product wafer is made up of the probe carriage wafer clamped to the product wafer. To simply illustrate the point, if for example it takes t hours to write one wafer and a throughput of N wafers/hour is desired, then at least Nt wafers are written in parallel. This suggests that Nt product wafers are each clamped to their individual probe carriage wafers for patterning in parallel. After one batch of, for example, 200 such product wafers are written, the probe carriages may be reused after cleaning the probe tips. In this way, the primary cost of critical layer lithography, falls on the fabrication, maintenance and cleaning of the probe carriage wafers. The probe tips may be cleaned as easily or more easily than a reticle used in conventional photolithography.

Figure 2:
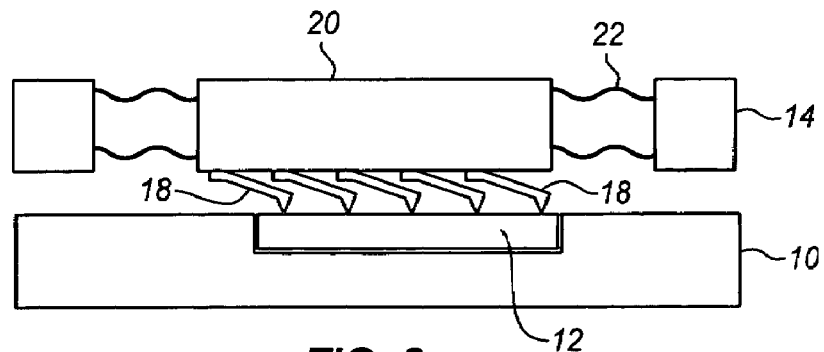
FIG. 2 is a cross-sectional diagram of a moving sled and corresponding single chip of the probe carriage and substrate of FIG. 1 according to an embodiment of the invention.

FIG. 2, shows an enlarged cross-sectional diagram of a single scanning stage 20 carrying an array of probe tips 20. In this case, 5 probe tips are shown in one direction, however, as mentioned above, a single scanning stage may have many more and the array of probes may extend in two directions. In the example of FIG. 2, for a square chip 12, there will be 5 rows and 5 columns of probe tips, for a total of 25 probe tips that can be individually be switched on or off by moving each one up or down (Z actuation). The moving scanning stage 20 is attached to the probe carriage 14 with a suspension system 22. The actual X-Y scanning of the stages is accomplished with actuators, as described in more detail below.

Figure 3:
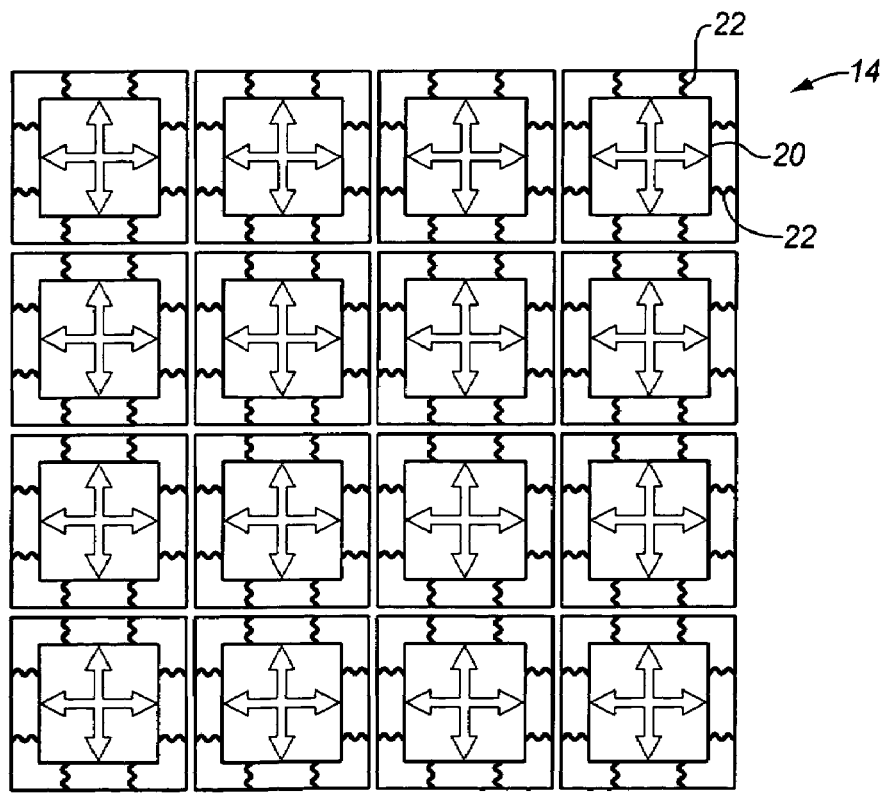
FIG. 3 is a top elevation view diagram of a portion of a probe carriage according to an embodiment of the invention.

FIG. 3 is a diagram of a portion of the probe carriage 14, showing sixteen of the scanning stages 20. The probe carriage has a large array of X-Y positioning stages in both directions and each stage has a large array of probe tips (not shown). One chip site can be written with a single stage or split between multiple stages with each sub field being stitched. The suspension systems 22 enables each stage to move freely and independently in the X-Y direction, while being tethered to the probe carriage. The actual motion of the stages may be accomplished with actuators. The actuators may be realized by a variety of different structures as described below.

Figure 4:
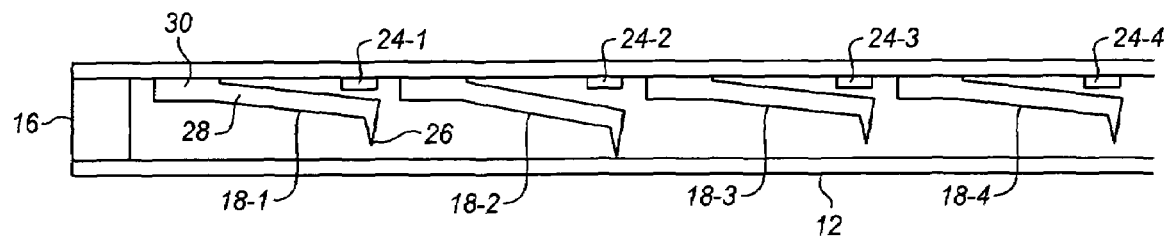
FIG. 4 is a diagram of a set of probes and independent actuators according to an embodiment of the invention.

As shown in the diagram of FIG. 4, individual probes can be turned ON or OFF by controlling their vertical positions. In FIG. 4, the vertical position of each probe is independently controlled by applying a voltage to an actuation control pad.

Each probe has a tip 26 at one end attached to a flexible arm 28 attached to a mount 30 opposite the tip. The mount attaches the probe to the X-Y stage or sled. The arm has some resiliency to maintain the tip in a neutral, partially raised position. The mount has an electrical contact (not shown) that allows a voltage to be driven into the probe. The actuator 24 has an electrical contact (not shown) that allows a voltage to independently be driven into the actuator. By charging the probe and the actuator differently, an electrostatic attraction can be generated. The strength of the attractive force may be controlled by controlling the magnitude of the potential difference (voltage difference) between the cantilever and the actuation pad. The force of the probe may be used to control the depth of the indentation generated by the probe tip.

The first, second and third probes 18-1, 18-2, 18-4 are in a raised position and do not touch the substrate because a particular voltage is applied to the respective actuator pad 24-1, 24-2, 24-4. Alternatively, the probe tips may be raised because of a resilient force in the probe arm or some other structure that pulls the probe tip up when no voltage is applied. The third probe 18-3, however, has been driven into the substrate by applying the opposite voltage to its actuator pad 24-3. The particular nature of the actuator and the mechanical configuration of the pins may be modified to suit a particular application. Magnetic or thermally generated forces may be used instead of electrostatic forces. Spring forces may be designed into the probe to apply a downward or upward force to each probe. Hinges, lever arms, pistons, solenoids, and other structures may alternatively be used to construct a probe. The flexible arm design shown in the figures is intended only as an example.

Structures such as those shown in FIGS. 1-4 may be produced using conventional MEMS (Micro Electro-Mechanical Systems) technologies. This allows probes and stages to be produced at low cost. The entire probe carriage can be constructed on a single wafer with conventional MEMS technology. So, notwithstanding the large number of probes and the many features to drive each scanning stage and probe pin, the overall structure is not expensive in the context of masks and reticles for photolithography. The wafer with the probe carriage can then be attached simply to the wafer that is to be patterned with some form of clamp 16.

Figure 5:
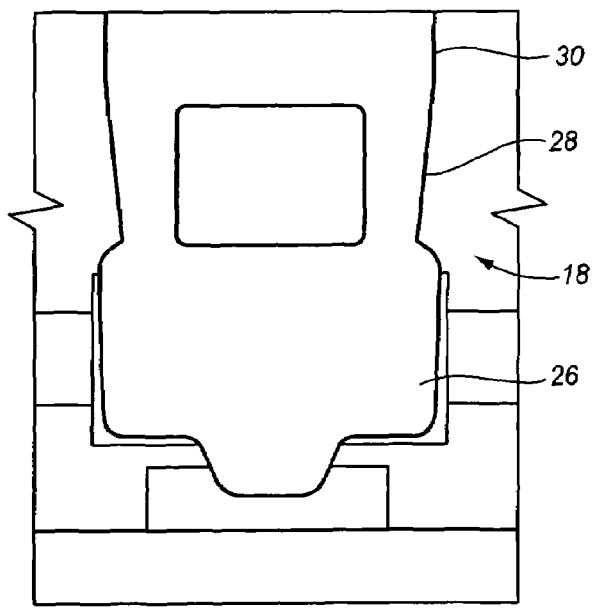
FIG. 5 is a top elevation view diagram of a probe according to an embodiment of the invention.

FIG. 5 shows an example of a micro cantilever suitable for use as the probe 18 described above. FIG. 5 is a diagram based on an electron scanning microscope image of a part produced using MEMS technology. The cantilever is micro-machined from silicon and built up with electroplated gold. The probe tip is on the opposite side and therefore not visible. The cantilever probe 18 has a mount 30 that attaches to the scanning stage structure and a flexible arm 28. The probe tip is opposite the mount on the underside of the probe as shown. As mentioned above, a variety of other probe tips may also be used. There are many ways to design cantilever and probe structures and FIG. 5 shows one example. Depending on how the resist layer will be exposed, it may be necessary to integrate, heaters, coils, optical fibers and other structures to the basic cantilever and tip design depicted in FIG. 5. Alternatively, the probes may be carried and actuated in a completely different manner.

Figure 6:
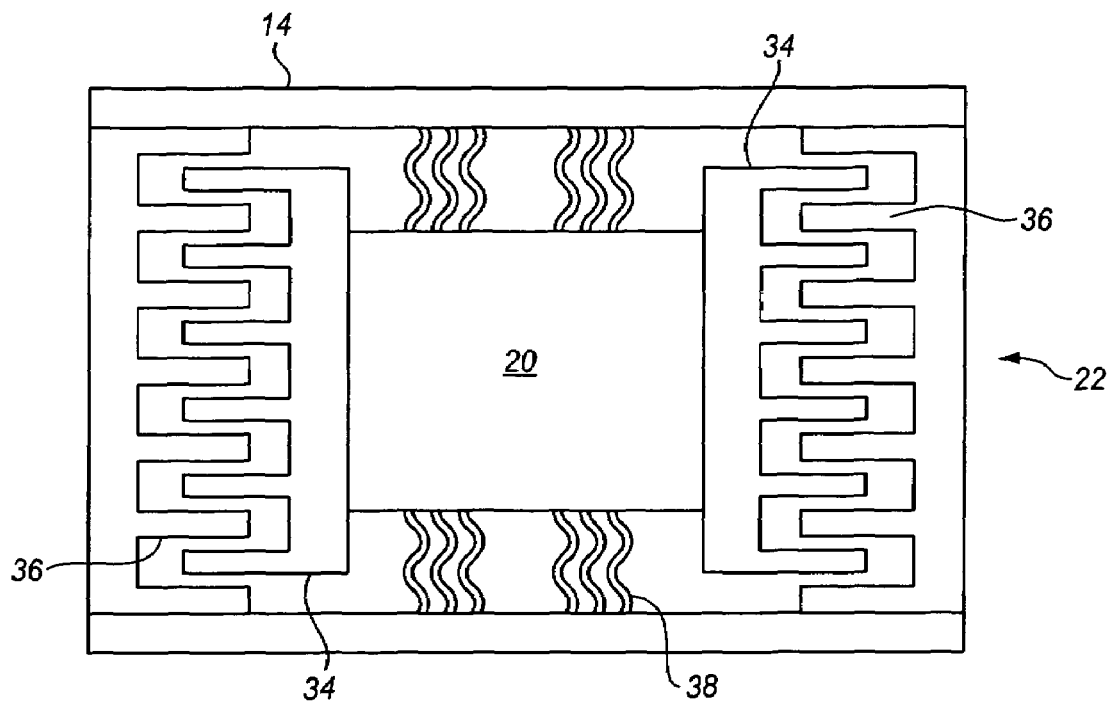
FIG. 6 is a diagram of a moving sled and comb drive actuator according to an embodiment of the invention.

FIG. 6 shows an example of a scanning stage structure that may be used for the examples of FIGS. 1-4. The scanning stage or sled 20 is attached to an electrostatic comb 34 on either side. These inner combs are interlaced each with a respective outer comb 36. The outer combs are attached to the probe carriage. Both the inner and outer combs are coupled to electrical contacts (not shown) that allow a voltage to be driven into each comb. The voltage at each comb provides an electrostatic attraction that moves the stage in the X or horizontal direction, as shown in FIG. 6. A suspension system 38 (formed for example of springs) is used to attach the stage to the probe carriage. This suspension system may be designed to be compliant in the direction of motion while being very stiff in every other direction (for example, the Z-direction).

Figure 7:
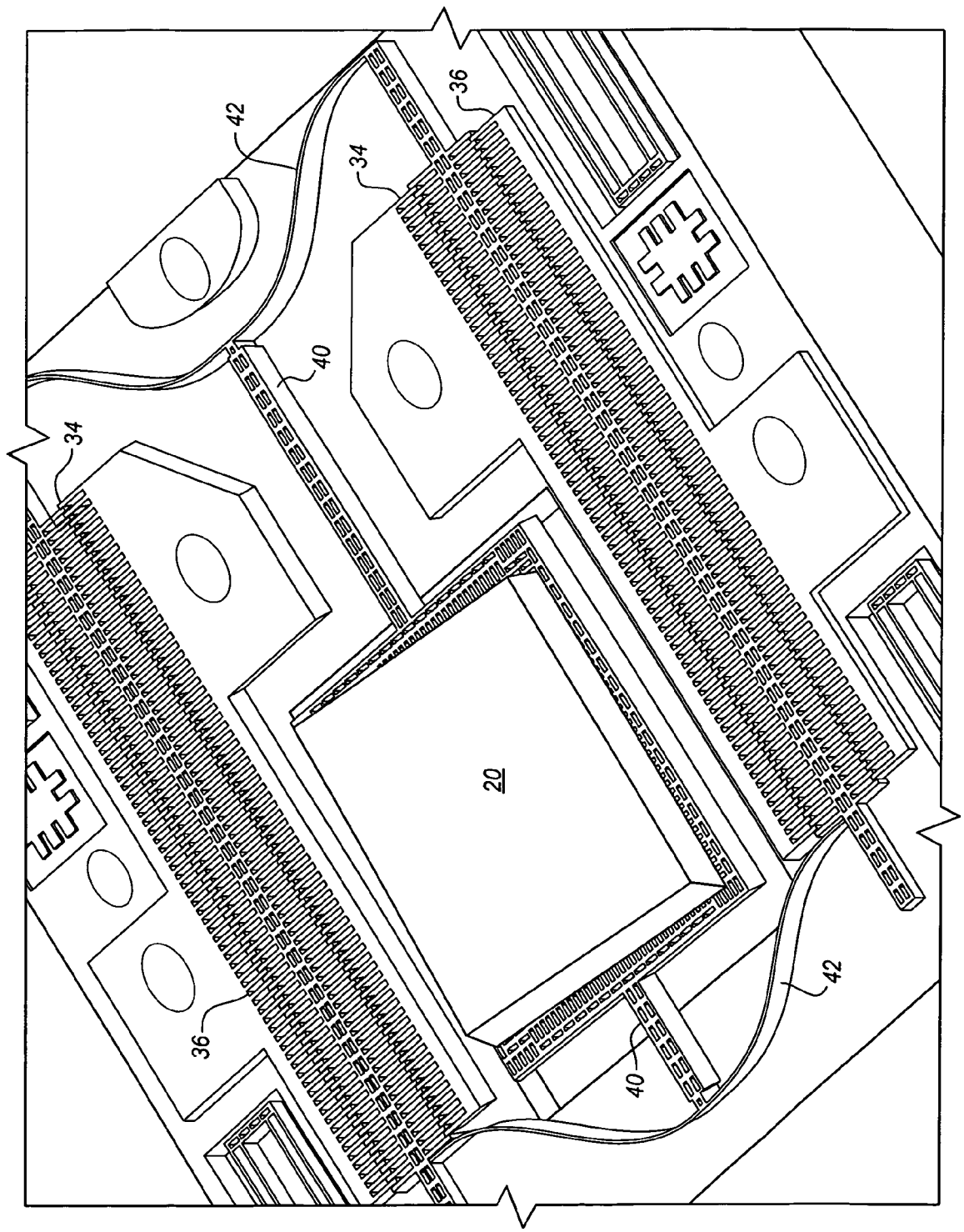
FIG. 7 is a perspective diagram of a moving sled with comb drive and leaf actuator according to an embodiment of the invention.

FIG. 7 is a diagram based on an electron scanning microscope image of an actual electrostatic comb drive driven MEMS X-Y positioning stage, micromachined from silicon. The scanning stage 20 is attached to the probe carriage 14 by a beam 40. A comb drive has inner and outer combs 34, 36 to drive the scanning stage in one direction. For movement in the perpendicular direction, a leaf 42 is coupled to the two outer combs. For perpendicular motion, the outer combs can be moved towards and away from the scanning stage. This straightens or bends the leaf to drive the scanning stage along the beam 40. The leaf provides one example of a drive for the scanning stage. Alternatively, combs may be provided for both directions or a variety of other mechanical designs may be used. The typical travel of a scanning stage such as that of FIGS. 6 and 7 is on the order of 25 micrometers in either direction.

Figure 8:
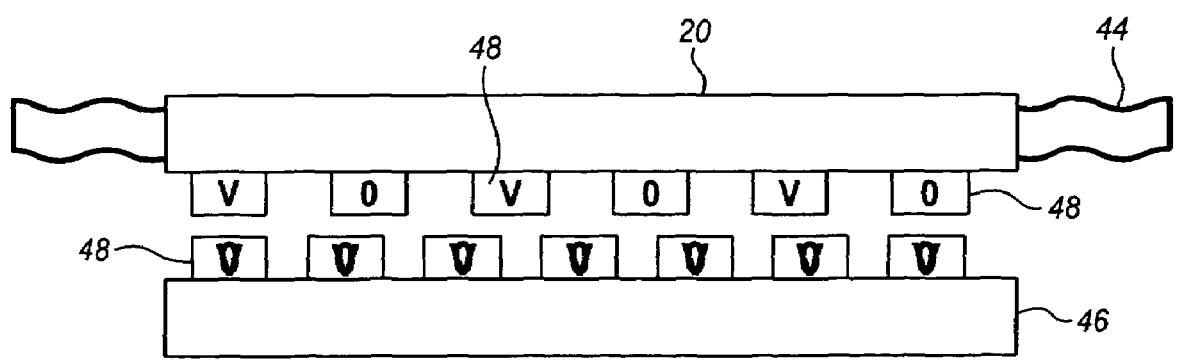
FIG. 8 is a diagram of a moving sled and linear drive actuator mounted on a fixed second substrate according to an embodiment of the invention.

An alternative to the electrostatic comb driven stage is the electrostatic surface drive. FIG. 8 shows a diagram of such an alternative drive system for a scanning stage. In FIG. 8, the scanning platform 20 is maintained in place by the suspension system (for example springs) 44. In this drive system, the stage operates as an electrostatic linear or stepper motor, with the moving platform as a rotor and the probe carriage as a stator 46. Both the rotor and the stator have charged nodes 48 the voltages of which are switched with the appropriate timing to move the stage to the left or right as shown in the diagram. S and T indicate the pitch of the electrodes on the stator and on the rotor, respectively. These pitches are slightly different (for example 5:7, 9:11 etc). This slight difference leads to a vernier which provides great positional accuracy. While the X-Y stage actuation is shown as being driven with electro-static forces, electromagnetic forces (magnetic actuation) and forces caused by thermal expansion or thermal actuation may also be used. A similar configuration may be used to move the rotor in the perpendicular direction.

As can be seen comparing FIG. 6 and FIG. 8, the FIG. 6 version allows all components to be formed on a single wafer, however, the drive system consumes a significant amount of the area of the wafer. In the FIG. 8 version, two wafers are used, increasing the complexity of the system, but the drive system may be designed so as not to take up any surface area on the wafer that carries the scanning stage. These examples show how the particular configuration of the drive system may be designed to meet a variety of different applications and design needs.

In a large array such as that described for patterning an entire wafer at one time, there may be significant temperature gradients across the probe array. This may give anomalous thermal expansions which may lead to relative mis-registrations between the probes. To circumvent this, the writing may be done in temperature controlled environments such as are common in current photolithography systems. Such environments are able to produce a temperature variation of no more than 1° C. over an entire product wafer, probe wafer, carriage wafer combination. Such a stabilized environment should avoid any significant mis-registration. Alternatively, anomalous thermal expansions may be corrected in another way. For larger features, the thermal expansions may be less significant.

The probe based patterning described above provides a high degree of scalability. Very large features and very small features may be created, as small as perhaps less than 5 nm. For mechanical indentation. the resolution depends largely on three well defined parameters: 1) Probe tip radius; 2) Resist thickness; and 3) Positioning accuracy of the X-Y stage. The first two parameters may be continuously improved over time without inherent limits. The positioning accuracy can be improved with improvements in servo loops. The resolution possible from the probe tips may be improved with very accurate thermal control during the writing. By minimizing localized thermal effects, the accuracy of the written features is improved and features may be placed closer together.

Since making the probe tips and the stages does not require high resolution lithography, the cost of producing the probe carriage and all its components is not great. This keeps the total cost of producing very high resolution scaling features using the probe tips lower. In addition, the same probe carriage may be used to write a variety of different patterns. As a result, the same carriage probe may be used to pattern many different layers on a single wafer. While the probe carriage may be removed for, etching, implanting and other processes, the probe carriage may be reinstalled for writing the next pattern after any cleaning, if appropriate. This reduces the total number of probe carriages that are needed and accordingly, the total cost of producing all of the probe carriages.

In addition to writing features on a photoresist or other layer of a substrate, an array of probes as described above may also be configured to write patterns on a mask. The principles, methods and structures described above may all be used for making a mask by substituting a mask substrate for the product substrate. With an ability to write features as small as 5 nm, the mask may be a conventional 4x mask, a 1x mask, or any other mask. The pattern on a conventional 4x mask is normally subject to a four fold reduction through projection optics before it illuminates a layer of photoresist on the wafer. A 1x mask may be used for contact printing so that the lithography system does not require any reduction projection optics. This may be particularly useful with, for example, imprint lithography, a very low cost process that has been hampered by the difficulty in producing high quality, defect free 1x masks. Probe based patterning methods may provide for the low cost high resolution 1x masks that have so not been possible.

To make a patterned mask, in one example a quartz plate mask substrate may be plated with chrome. The probe carriage may be clamped to the mask substrate and the entire mask substrate may be written by drawing features into the chrome, removing chrome to produce transparent areas on the mask. The mask may then be processed to finalize the structures and clean any residues. The mask features may be written in parallel by the multiple probes. Other types of masks made from other materials may also be used. For example, a reflective mask may be made by coating an absorptive mask substrate with a reflective material and then removing the reflective material with the probe tips to define the features. As another alternative, a layer may be formed on the mask substrate that is then patterned by the probes with further processing after the writing process. Even a resist layer may be used on the mask substrate that is patterned by the probes. Such an approach may be faster and less expensive than charged particle writing methods, especially for very small features.

A lesser or more complex probe carriage, scanning sled, probe, probe tip, actuation and motor system, lithography process, or system may be used than those shown and described herein. Therefore, the configurations may vary from implementation to implementation depending upon numerous factors, such as price constraints, performance requirements, technological improvements, or other circumstances. Embodiments of the invention may also be applied to other types of lithography systems that use different materials and devices than those shown and described herein. The patterns may be drawn in photoresist or in a variety of other materials to accomplish steps in producing a microelectronic or micromechanical device. While the probe carriage and probes may be produced using MEMS technologies, they may also be produced in any of a variety of other ways.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. An apparatus comprising:
   a probe carriage constructed on a wafer;
   a plurality of scanning stages constructed on the same wafer carried by and coupled to the probe carriage, the scanning stages being individually movable across the surface of an adjacent substrate;
   a first electrostatic drive coupled between each scanning stage and the probe carriage to provide independent translation of each scanning stage in a first direction with respect to the probe carriage;
   a second electrostatic drive coupled between each scanning stage and the probe carriage to provide independent translation of each scanning stage in a second direction with respect to the probe carriage;
   a suspension system to allow movement through the electrostatic drives in the first direction and the second direction while holding the scanning stages to the probe carriage; and
   a plurality of probes constructed on the same wafer and attached to each scanning stage, each probe tip being individually movable towards and away from the adjacent substrate to write patterns in the substrate when moved toward the substrate based on the movement of the respective scanning stage.

2. The apparatus of claim 1, wherein the adjacent substrate comprises a silicon wafer.

3. The apparatus of claim 1, wherein the adjacent substrate comprises a photolithography mask.

4. The apparatus of claim 1, wherein the patterns comprise portions of microelectronic devices.

5. The apparatus of claim 1, further comprising a clamp to attach the probe carriage to a wafer carrier, the wafer comprising the adjacent substrate.

6. The apparatus of claim 1, wherein the scanning stages are movable in two perpendicular directions and the probe tips are movable in a third perpendicular direction.

7. The apparatus of claim 1, wherein the probes comprise a probe arm with a mount at one end of the arm and the tip at the opposite end of the arm.

8. The apparatus of claim 1, wherein the first and second electrostatic drives comprise comb drives.

9. The apparatus of claim 1, wherein the substrate contains a plurality of separate chips and wherein scanning stages are positioned over each chip to write duplicate patterns simultaneously in each chip.

10. The apparatus of claim 1, wherein the first and second electrostatic drives comprise linear stepping motors.

11. The apparatus of claim 1, wherein the first and second electrostatic drives are formed on a second wafer.

12. The apparatus of claim 1, wherein the suspension system comprises springs connected between the scanning stages and the probe carriage.

13. The apparatus of claim 1, wherein the probe tips are operated to write features into a layer formed on the adjacent substrate.

14. The apparatus of claim 13, wherein the layer comprises photoresist.

15. The apparatus of claim 13, wherein the layer comprises reflective metal on a mask substrate, and wherein writing features comprises removing chrome from the mask.

16. The apparatus of claim 13, wherein operating comprises driving probe tips into the formed layer to form indentations.

17. The apparatus of claim 13, wherein operating comprises driving the probe tips into the formed layer and moving the scanning stages to which the probe tips are attached to form indented patterns in the formed layer.

18. The apparatus of claim 13, wherein operating comprises operating individual electrostatic actuators coupled to each probe, respectively.

19. The apparatus of claim 1, wherein the scanning stages are moved to write patterns into a layer formed on the adjacent substrate using the probes.

20. The apparatus of claim 19, wherein moving the scanning stages comprises moving a plurality of duplicate scanning stage groups to write duplicate patterns into a plurality of chip sections of the adjacent substrate.

* * * * *